(12) United States Patent
Le et al.

(10) Patent No.: US 10,224,399 B2
(45) Date of Patent: *Mar. 5, 2019

(54) STRAIN COMPENSATION IN TRANSISTORS

(71) Applicant: Intel Corporation, Santa Clara, CA (US)

(72) Inventors: Van H. Le, Portland, OR (US); Benjamin Chu-Kung, Hillsboro, OR (US); Harold Hal W. Kennel, Portland, OR (US); Willy Rachmady, Beaverton, OR (US); Ravi Pillarisetty, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/892,182

(22) Filed: Feb. 8, 2018

(65) Prior Publication Data

US 2018/0261669 A1    Sep. 13, 2018

Related U.S. Application Data

(63) Continuation of application No. 15/447,044, filed on Mar. 1, 2017, now Pat. No. 9,911,807, which is a
(Continued)

(51) Int. Cl.
*H01L 29/06*   (2006.01)
*H01L 29/16*   (2006.01)
(Continued)

(52) U.S. Cl.
CPC .... *H01L 29/0673* (2013.01); *H01L 21/02532* (2013.01); *H01L 21/283* (2013.01);
(Continued)

(58) Field of Classification Search
CPC ... H01L 29/06; H01L 29/067; H01L 29/0673; H01L 29/064; H01L 29/0649;
(Continued)

(56) References Cited

U.S. PATENT DOCUMENTS 6,800,887 B1   10/2004   Weber et al.
6,858,483 B2   2/2005    Doczy et al.
(Continued)

FOREIGN PATENT DOCUMENTS

KR   10-131798 B1     4/2011
KR   101031798 81     4/2011
(Continued)

OTHER PUBLICATIONS

Office Action Received for Taiwanese Patent Application No. 101145439, dated Nov. 27, 2014, 3 Pages of Taiwanese Office Action and 3 Pages of English Translation.
(Continued)

*Primary Examiner* — Monica D Harrison
(74) *Attorney, Agent, or Firm* — Schwabe, Williamson & Wyatt P.C.

(57) ABSTRACT

Transistor structures having channel regions comprising alternating layers of compressively and tensilely strained epitaxial materials are provided. The alternating epitaxial layers can form channel regions in single and mitigate transistor structures. In alternate embodiments, one of the two alternating layers is selectively etched away to form nanoribbons or nanowires of the remaining material. The resulting strained nanoribbons or nanowires form the channel regions of transistor structures. Also provided are computing devices comprising transistors comprising channel regions comprised of alternating compressively and tensilely strained epitaxial layers and computing devices com-
(Continued)

prising transistors comprising channel regions comprised of strained nanoribbons or nanowires.

20 Claims, 10 Drawing Sheets

Related U.S. Application Data continuation of application No. 15/063,371, filed on Mar. 7, 2016, now Pat. No. 9,614,093, which is a continuation of application No. 14/825,130, filed on Aug. 12, 2015, now Pat. No. 9,306,068, which is a continuation of application No. 13/977,188, filed as application No. PCT/US2011/064096 on Dec. 9, 2011, now Pat. No. 9,159,823.

(51) Int. Cl.

| | | |
|---|---|---|
| *H01L 29/786* | (2006.01) | |
| *H01L 29/423* | (2006.01) | |
| *H01L 29/66* | (2006.01) | |
| *H01L 29/78* | (2006.01) | |
| *H01L 21/02* | (2006.01) | |
| *H01L 21/283* | (2006.01) | |
| *H01L 29/10* | (2006.01) | |
| *H01L 29/165* | (2006.01) | |
| *H01L 29/15* | (2006.01) | |
| *H01L 29/161* | (2006.01) | |
| *H01L 29/08* | (2006.01) | |

(52) U.S. Cl.
CPC ...... *H01L 29/0649* (2013.01); *H01L 29/0847* (2013.01); *H01L 29/1054* (2013.01); *H01L 29/155* (2013.01); *H01L 29/161* (2013.01); *H01L 29/165* (2013.01); *H01L 29/42392* (2013.01); *H01L 29/66431* (2013.01); *H01L 29/66477* (2013.01); *H01L 29/66651* (2013.01); *H01L 29/66795* (2013.01); *H01L 29/78* (2013.01); *H01L 29/785* (2013.01); *H01L 29/7842* (2013.01); *H01L 29/7849* (2013.01); *H01L 29/7851* (2013.01); *H01L 29/78681* (2013.01); *H01L 29/78687* (2013.01); *H01L 29/78696* (2013.01)

(58) Field of Classification Search
CPC ... H01L 29/08; H01L 29/084; H01L 29/0847; H01L 29/10; H01L 29/105; H01L 29/1054; H01L 29/15; H01L 29/155; H01L 29/16; H01L 29/165; H01L 29/66; H01L 29/664; H01L 29/6647; H01L 29/66477; H01L 29/78; H01L 29/784; H01L 29/7842
USPC .......................................................... 257/19
See application file for complete search history.

(56) References Cited

U.S. PATENT DOCUMENTS

| | | | |
|---|---|---|---|
| 6,953,719 B2 | 10/2005 | Doczy et al. | |
| 6,972,225 B2 | 12/2005 | Doczy et al. | |
| 7,126,199 B2 | 10/2006 | Barns et al. | |
| 7,187,057 B2 | 3/2007 | Armstrong et al. | |
| 7,192,856 B2 | 3/2007 | Brask et al. | |
| 7,226,824 B2 | 6/2007 | Armstrong et al. | |
| 7,316,949 B2 | 1/2008 | Doczy et al. | |
| 7,329,913 B2 * | 2/2008 | Brask .............. | H01L 21/823821 257/287 |
| 7,470,972 B2 | 12/2008 | Kavalieros et al. | |
| 7,525,160 B2 | 4/2009 | Brask et al. | |
| 7,569,869 B2 | 8/2009 | Chau et al. | |
| 7,592,213 B2 | 9/2009 | Datta et al. | |
| 7,629,603 B2 | 12/2009 | Chui et al. | |
| 7,709,312 B2 | 5/2010 | Jin et al. | |
| 7,759,142 B1 | 7/2010 | Majhi et al. | |
| 7,825,400 B2 | 11/2010 | Datta et al. | |
| 7,902,058 B2 | 3/2011 | Brask et al. | |
| 7,947,971 B2 | 5/2011 | Dewey et al. | |
| 8,120,065 B2 | 2/2012 | Brask et al. | |
| 8,129,795 B2 | 3/2012 | Brask et al. | |
| 8,288,233 B2 | 10/2012 | Jin et al. | |
| 8,421,059 B2 | 4/2013 | Datta et al. | |
| 8,530,884 B2 | 9/2013 | Datta et al. | |
| 9,306,068 B2 | 4/2016 | Le et al. | |
| 9,911,807 B2 * | 3/2018 | Le ....................... | H01L 29/0673 |
| 2004/0195624 A1 | 10/2004 | Liu et al. | |
| 2004/0227181 A1 | 11/2004 | Choe et al. | |
| 2006/0076625 A1 | 4/2006 | Lee et al. | |
| 2006/0237801 A1 | 10/2006 | Brask et al. | |
| 2006/0292776 A1 | 12/2006 | Brask et al. | |
| 2007/0122984 A1 | 5/2007 | Zhu et al. | |
| 2007/0241367 A1 | 10/2007 | Ouyang et al. | |
| 2008/0265280 A1 | 10/2008 | Currie | |
| 2009/0090934 A1 | 4/2009 | Tezuka | |
| 2010/0187503 A1 | 7/2010 | Moriyama et al. | |
| 2011/0147706 A1 | 6/2011 | Radosavljevic et al. | |
| 2012/0074464 A1 | 3/2012 | Cea et al. | |
| 2012/0161105 A1 | 6/2012 | Rachmady et al. | |
| 2013/0277714 A1 | 10/2013 | Le et al. | |

FOREIGN PATENT DOCUMENTS

| | | |
|---|---|---|
| TW | 200514200 A | 4/2005 |
| TW | 200733384 | 9/2007 |
| WO | WO 2013/085534 A1 | 6/2013 |

OTHER PUBLICATIONS

International Preliminary Report on Patentability received for PCT Patent Application No. PCT/US2011/064096, dated Jun. 19, 2014, 8 pages.
International Search Report and Written Opinion received for International Application No. PCT/US2011/064096, dated Aug. 24, 2012, 11 pages.
Office Action including Search Report (3 paged) dated Sep. 19, 2016 issued by the Examiner of the Intellectual Property Office (the I PO) for Taiwanese Patent Application No. 104117440 and English Translation (3 pages) thereof.
Notice of Allowance (2 pages) dated Aug. 2, 2016 from the State Intellectual Property Office (SIPO) for Chinese Application No. 201180075405.6 and English Translation (1 page) thereof.
First Office Action from the Chinese Patent Office dated Feb. 29, 2016 for Chinese Patent Application No. 201180075405.6.
Office Action for Germany Patent Application No. 112011105926.4 dated Apr. 6, 2018, 26 pgs., with English translation.

* cited by examiner

STRAIN COMPENSATION IN TRANSISTORS

This is a Continuation of application Ser. No. 15/447,044 filed Mar. 1, 2017, which is a Continuation of application Ser. No. 15/063,371 filed Mar. 7, 2016 now U.S. Pat. No. 9,614,093 issued Apr. 4, 2017, which is a Continuation of application Ser. No. 14/825,130 filed Aug. 12, 2015 now U.S. Pat. No. 9,306,068 issued Apr. 5, 2016, which is a Continuation of application Ser. No. 13/977,188 filed Jun. 28, 2013 now U.S. Pat. No. 9,159,823 issued Oct. 13, 2015, which is a U.S. National Phase Application under 35 U.S.C. § 371 of International Application No. PCT/US2011/064096 filed Dec. 9, 2011 which are hereby incorporated by reference.

FIELD OF THE INVENTION

Embodiments of the invention relate generally to integrated circuit devices, and more specifically to transistors, multigate transistors, PMOS and NMOS transistors, and nanoribbon and nanowire transistors.

BACKGROUND INFORMATION

The push toward ever-smaller more highly integrated circuit (IC) and other semiconductor devices places enormous demands on the techniques and materials used to construct the devices. In general, an integrated circuit chip is also known as a microchip, a silicon chip, or a chip. IC chips are found in a variety of common devices, such as in computers, cars, televisions, game systems, CD players, and cellular phones. A plurality of IC chips are typically built on a silicon wafer (a thin silicon disk, having a diameter, for example, of 300 mm) and after processing the wafer is diced apart to create individual chips. A 1 cm² IC chip having feature sizes around of about 90 nm can comprise hundreds of millions of components. Current technologies are pushing feature sizes even smaller than 32 nm. Components of IC chips include, for example, transistors such as CMOS (complementary metal-oxide-semiconductor) devices, capacitive structures, resistive structures, and metal lines that provide electronic connections between components and external devices. Other semiconductor devices include, for example, various diodes, lasers, photodetectors, and magnetic field sensors.

DETAILED DESCRIPTION OF THE INVENTION

As the pitch of the elements of a transistor are made increasingly smaller, the source and drain region volume shrinks and providing uniaxial transistor channel stress through the source and drain regions becomes increasingly difficult. Stress in the channel region of a transistor can improve transistor performance. Therefore, devices that incorporate stress into the channel region without relying on the source and drain regions to supply stress are useful. Embodiments of the invention provide transistors having channel structures having stress imparted from the substrate. Also provided are channel structures comprised of interlayered compressive and tensile layers and methods of making such channel structures. Additional embodiments of the invention provide transistors having a plurality of strained nanoribbons or nanowires in the channel region. Advantageously, embodiments of the invention provide transistors having strained channel structures having significant heights while maintaining strain in the channel structure.

Figure 1A:
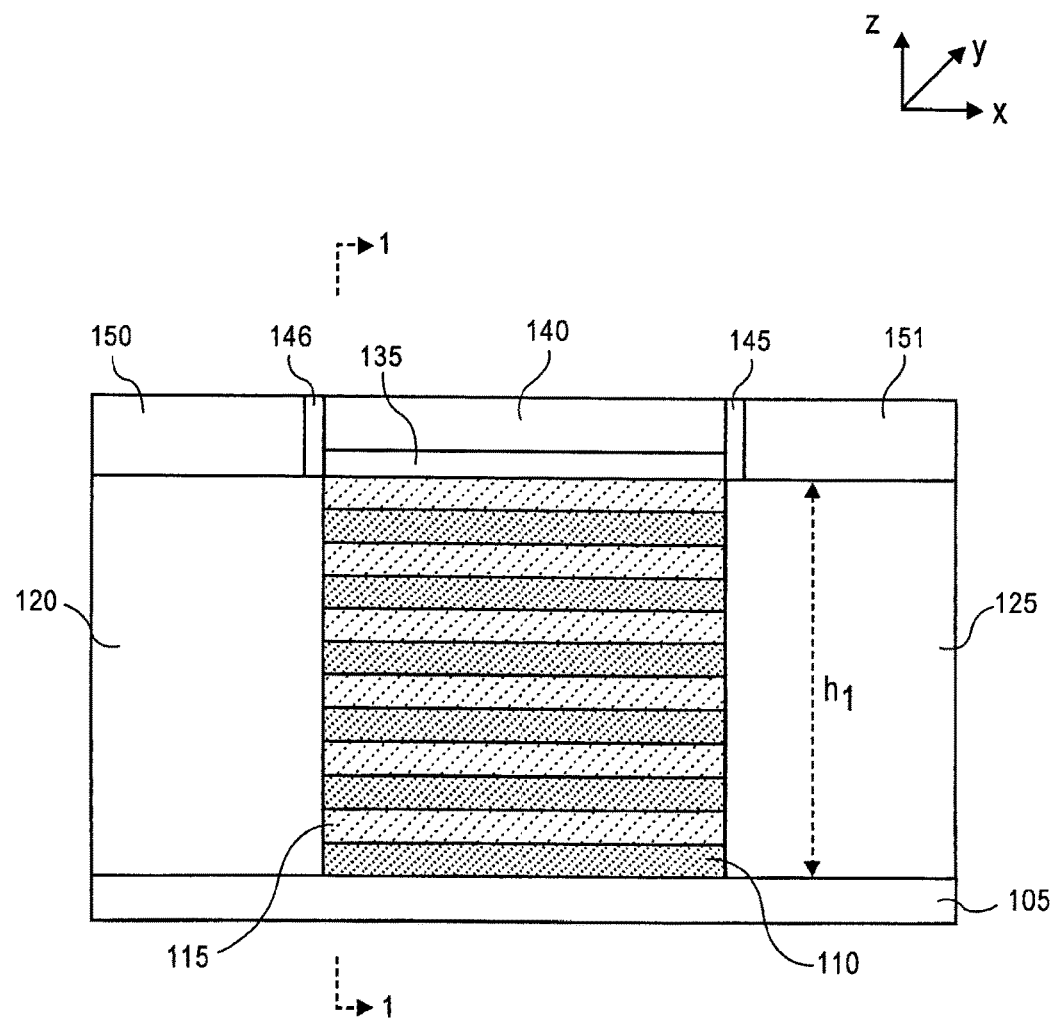
FIGS. 1A-B are schematic diagrams illustrating cross-sectional views of a tri-gate transistor structure.
Figure 1B:
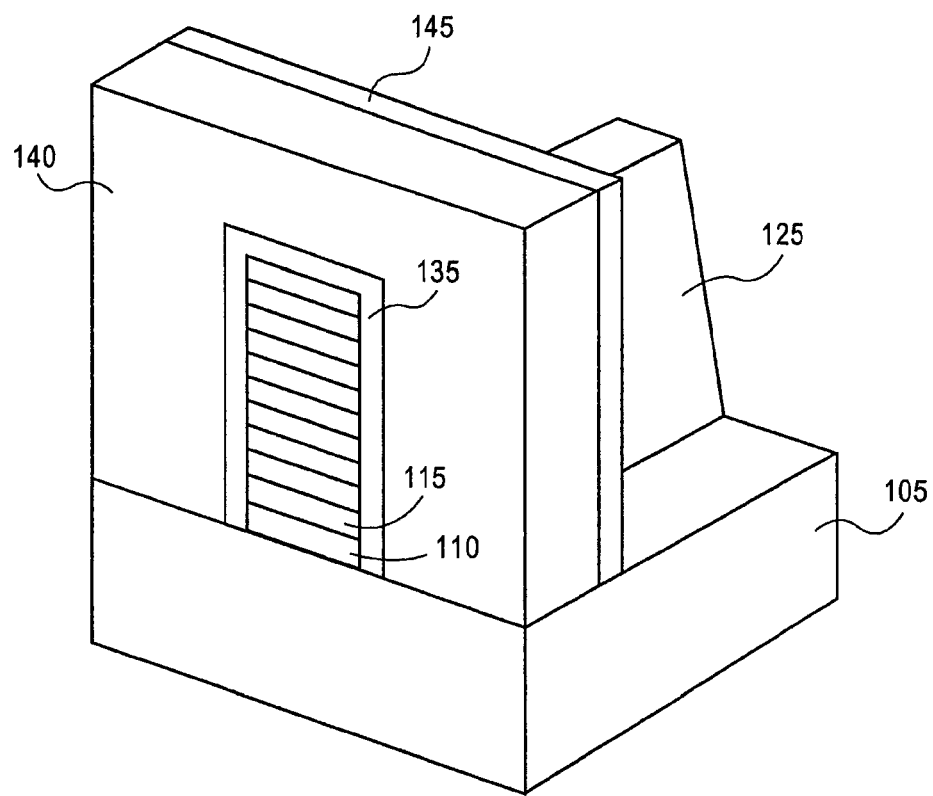

FIGS. 1A-B show a trigate transistor structure having a strained channel region. FIG. 1B represents a view along 1-1 (a perpendicular cut into the page) of the structure of FIG. 1A. The resulting cross sectional view is rotated by 45°. In FIGS. 1A-B, a substrate 105 houses a channel region comprised of oppositely strained epitaxial interlayers 110 and 115. The oppositely strained epitaxial interlayers 110 and 115 are either compressively or tensilely strained with respect to the material on the substrate 105 surface. For example, layer 110 is tensilely strained and layer 115 is compressively strained or conversely layer 110 is compressively strained and layer 115 is tensilely strained. The oppositely strained epitaxial interlayers 110 and 115 are created through crystal lattice mismatches relative to the crystal lattice of the substrate 105 material or a layer of material on the substrate 105 surface ("the substrate"). The material selected for the substrate 105 can be, for example, any material comprising elements from group III, IV, and/or V of the periodic table, and combination thereof. Then, a first layer 110 with a larger (smaller) lattice constant is grown in an epitaxial deposition process on the substrate 105. The first layer 110 is grown below its critical layer thickness to ensure that full compressive (tensile) strain is preserved in the first layer 110. Subsequently, the second layer 115 with a smaller (larger) lattice constant with respect to substrate 105 is grown in an epitaxial deposition process on top of the first layer 100. The second layer 115 is grown below its critical layer thickness to ensure full tensile (compressive) strain. In embodiments of the invention, additional successive layers 110 and 115 having a pattern of alternating compressive and tensile strain can be grown to extremely tall heights with minimal to no strain relaxation. In general, the interlayers can be comprised of pure elements and/or mixtures of elements, such as, for example, Si and Ge, and III-V semiconductor materials (materials comprising elements found in columns III and V of the periodic table). In embodiments of the invention, the channel structures can comprise quantum wells in which a thin device layer is adjacent to or sandwiched between layers having a larger band gap compared to the channel material. In embodiments of the invention, the substrate 105 is comprised of $Si_XGe_{1-X}$, layer 110 (or layer 115) is comprised of $Si_YGe_{1-Y}$ where Y>X, and layer 115 (or layer 110) is comprised of $Si_ZGe_{1-Z}$ where Z<X, 1>X≥0, and 1≥Y>0, and 1>Z≥0. In additional embodiments, the substrate 105 is comprised of InP, layer 110 (or layer 115) is comprised of $In_XGa_{1-X}As$ where 1≥X>0.53, and layer 115 (or layer 110) is comprised of $In_YGa_{1-Y}As$ where 0.53>Y≥0. In further embodiments, the substrate 105 is comprised of GaSb, layer 110 (or layer 115) is comprised of AlSb, and layer 115 (or layer 110) is comprised of InAs. In further additional embodiments, the substrate 105 is comprised of Ge, layer 110 (or layer 115) is comprised of $Si_XGe_{1-X}$, and layer 115 (or layer 110) is comprised of $In_YGa_{1-Y}As$ where $1 \geq X>0$ and $1 \geq Y>0$. In further additional embodiments, the substrate 105 is GaAs, layer 110 (or layer 115) is $GaAs_XP_{1-X}$ where X is a number between 1 and 0, and layer 115 (or layer 110) is $In_YGa_{1-Y}P$ where $1 \geq Y>0.51$. It was found that by using epitaxial interlayered structures comprising alternating layers of compressively and tensilely strained epitaxial materials, it is possible to build channel structures that preserve strain in the layers while having larger heights than conventional methods of producing strain in channel regions of transistors. In embodiments of the invention, channel regions of transistors have heights, $h_1$, that range between 10 nm and 100 nm or between 25 nm and 85 mm, although other heights are also possible. Although twelve layers of oppositely strained epitaxial interlayers 110 and 115 are shown in FIG. 1, it is also possible to have other numbers of layers 115 and 110, such as, for example, between and including 3 and 25 layers or between 5 and 25 layers, although other numbers are also possible.

In FIG. 1A, source and drain regions 120 and 125 abut ends of the channel region 110 and 115. In embodiment of the invention, the channel strain with respect to the substrate is maintained in the channel region and does not require the use of source/drain materials that create strain in the channel. The transistor structure additionally comprises a gate dielectric 135 and a gate electrode 140. As can be seen from FIG. 1B, gate dielectric 135 is disposed on three sides of the channel region: two sides being transverse to a third side. The gate electrode 140 is disposed on the gate dielectric 135. Optionally, insulating spacers 145 and 146 (FIG. 1A) abut the gate dielectric 135 and the gate electrode 140. The transistor structure is typically covered in an insulating dielectric layer, which is partially shown as insulating regions 150 and 151 (FIG. 1A).

Figure 2A:
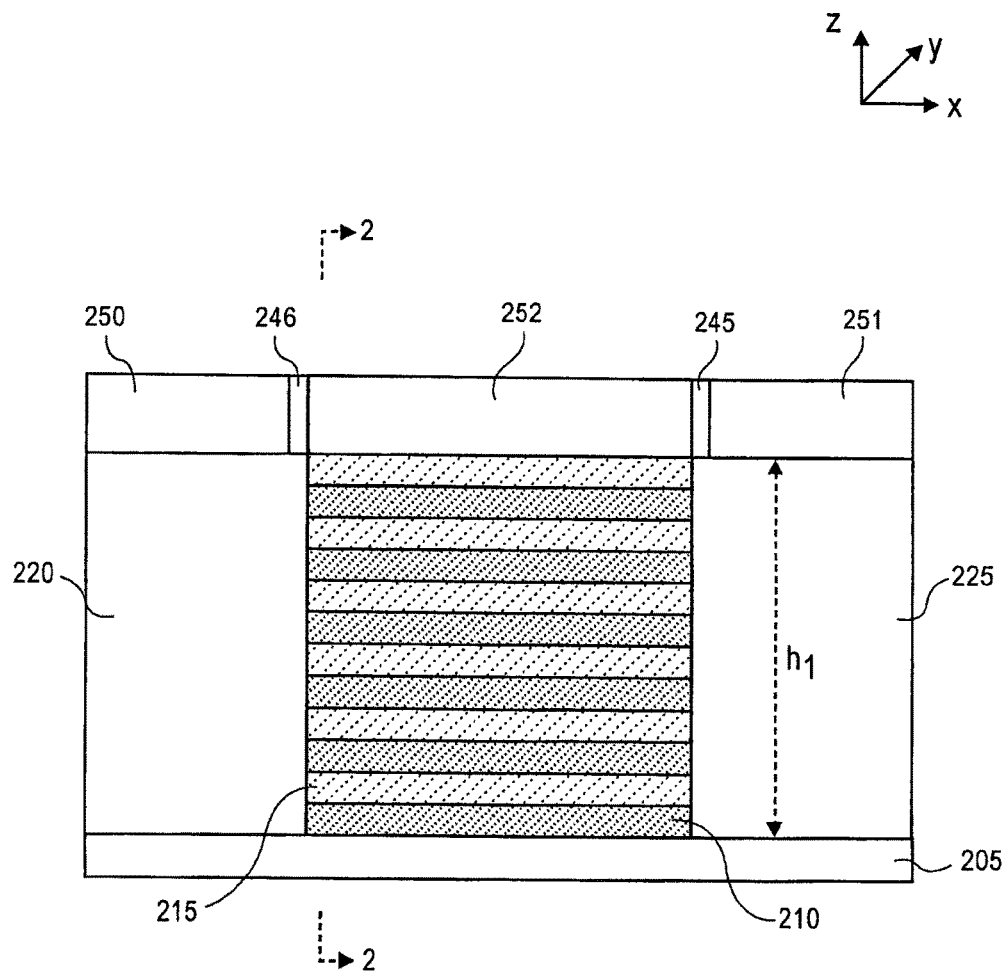
FIGS. 2A-B are schematic diagrams illustrating cross-sectional views of a bi-gate transistor structure.
Figure 2B:
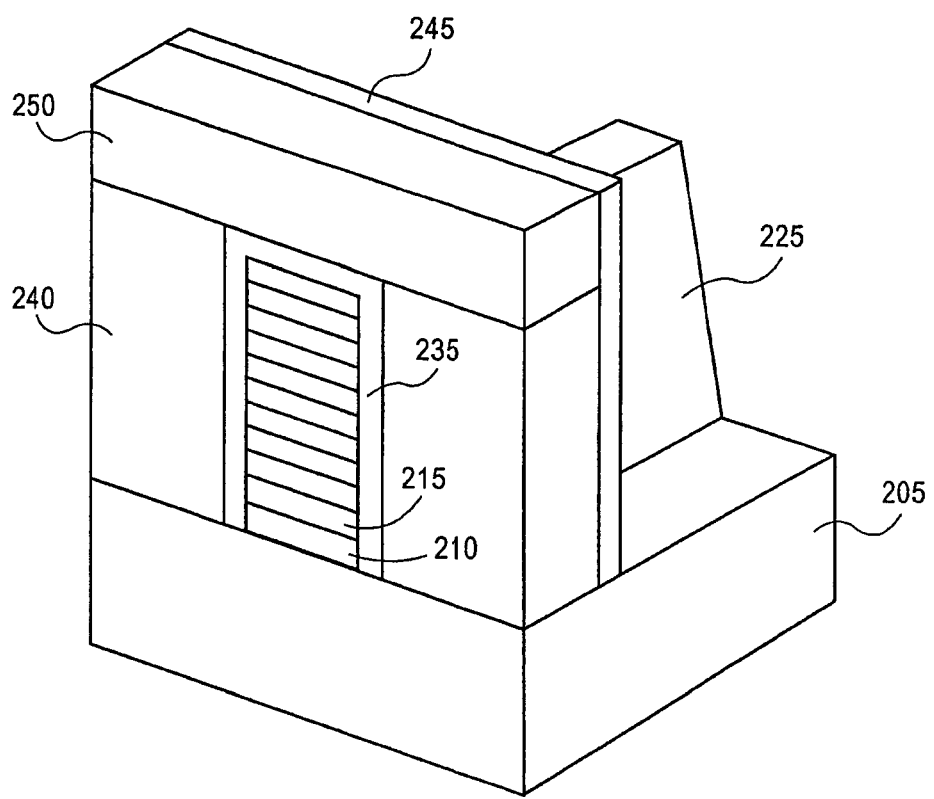

FIGS. 2A-B show a bigate (dual gate) transistor structure having a strained channel region. FIG. 2B represents a view along 2-2 (a perpendicular cut into the page) of the structure of FIG. 2A. The resulting cross sectional view is rotated by 45°. In FIGS. 2A-B, a substrate 205 houses a channel region comprised of oppositely strained epitaxial interlayers 210 and 215. The oppositely strained epitaxial interlayers 210 and 215 are either compressively or tensilely strained with respect to the material on the substrate 205 surface. For example, layer 210 is tensilely strained and layer 215 is compressively strained or conversely layer 210 is compressively strained and layer 215 is tensilely strained. The oppositely strained epitaxial interlayers 210 and 215 are created through crystal lattice mismatches relative to the crystal lattice of the substrate 205 material or a layer of material on the substrate 105 surface ("the substrate"). The material selected for the substrate 205 can be, for example, any material comprising elements from group III, IV, and/or V of the periodic table, and combination thereof. Then, a first layer 210 with a larger (smaller) lattice constant is grown in an epitaxial deposition process on the substrate 205. The first layer 210 is grown below its critical layer thickness to ensure that full compressive (tensile) strain is preserved in the first layer 210. Subsequently, the second layer 215 with a smaller (larger) lattice constant with respect to substrate 205 is grown in an epitaxial deposition process on top of the first layer 200. The second layer 215 is grown below its critical layer thickness to ensure full tensile (compressive) strain. In embodiments of the invention, additional successive layers 210 and 215 having a pattern of alternating compressive and tensile strain can be grown to extremely tall heights with minimal to no strain relaxation. In general, the interlayers can be comprised of pure elements and/or mixtures of elements, such as, for example, Si and Ge, and III-V semiconductor materials (materials comprising elements found in columns III and V of the periodic table). In embodiments of the invention, the channel structures can comprise quantum wells in which a thin device layer is adjacent to or sandwiched between layers having a larger band gap compared to the channel material. In embodiments of the invention, the substrate 205 is comprised of $Si_XGe_{1-X}$, layer 210 (or layer 215) is comprised of $Si_YGe_{1-Y}$ where $Y>X$, and layer 215 (or layer 210) is comprised of $Si_ZGe_{1-Z}$ where $Z<X$, $1>X \geq 0$, $1>Y>0$ and $1>Z \geq 0$. In additional embodiments, the substrate 205 is comprised of InP, layer 210 (or layer 215) is comprised of $In_XGa_{1-X}As$ where $1 \geq X>0.53$, and layer 215 (or layer 210 is comprised of $In_YGa_{1-Y}As$ where $0.53>Y \geq 0$. In further embodiments, the substrate 205 is comprised of GaSb, layer 210 (or layer 215) is comprised of AlSb, and layer 215 (or layer 210) is comprised of InAs. In further additional embodiments, the substrate 205 is comprised of Ge, layer 210 (or layer 215) is comprised of $Si_XGe_{1-X}$, and layer 215 (or layer 210) is comprised of $In_YGa_{1-Y}As$ where $1 \geq X>0$ and $1 \geq Y>0$. In further additional embodiments, the substrate 205 is GaAs, layer 210 (or layer 215) is $GaAs_XP_{1-X}$ where $1>X \geq 0$ is a number between 1 and 0, and layer 215 (or layer 210) is $In_YGa_{1-Y}P$ where $1 \geq Y>0.51$. It was found that by using epitaxial interlayered structures comprising alternating layers of compressively and tensilely strained epitaxial materials, it is possible to build channel structures that preserve strain in the layers while having larger heights than conventional methods of producing strain in channel regions of transistors. In embodiments of the invention, channel regions of transistors have heights, $h_1$, that range between 10 nm and 100 nm or between 25 nm and 85 mm, although other heights are possible. Although twelve layers of oppositely strained epitaxial interlayers 210 and 215 are shown in FIG. 2, it is also possible to have other numbers of layers 210 and 215, such as, for example, between and including 3 and 25 layers between 5 and 25 layers.

In FIG. 2A, source and drain regions 220 and 225 abut ends of the channel region 210 and 215. In embodiments of the invention, the channel strain with respect to the substrate is maintained in the channel region and does not require the use of source/drain stressors. A further insulating region 252 is disposed on a side of channel region 210 and 215. In FIG. 2B, the transistor structure additionally comprises a gate dielectric 235 and a gate electrode 240. The gate dielectric 235 is disposed on two opposing sides of the channel region. The gate electrode 240 is disposed on the gate dielectric 235. Optionally, insulating spacers 245 and 246 (FIG. 2A) abut the gate dielectric 235 and the gate electrode 240. The transistor structure is typically covered in an insulating dielectric layer, which is partially shown as insulating regions 250 and 251 (FIG. 2A).

Figure 3A:
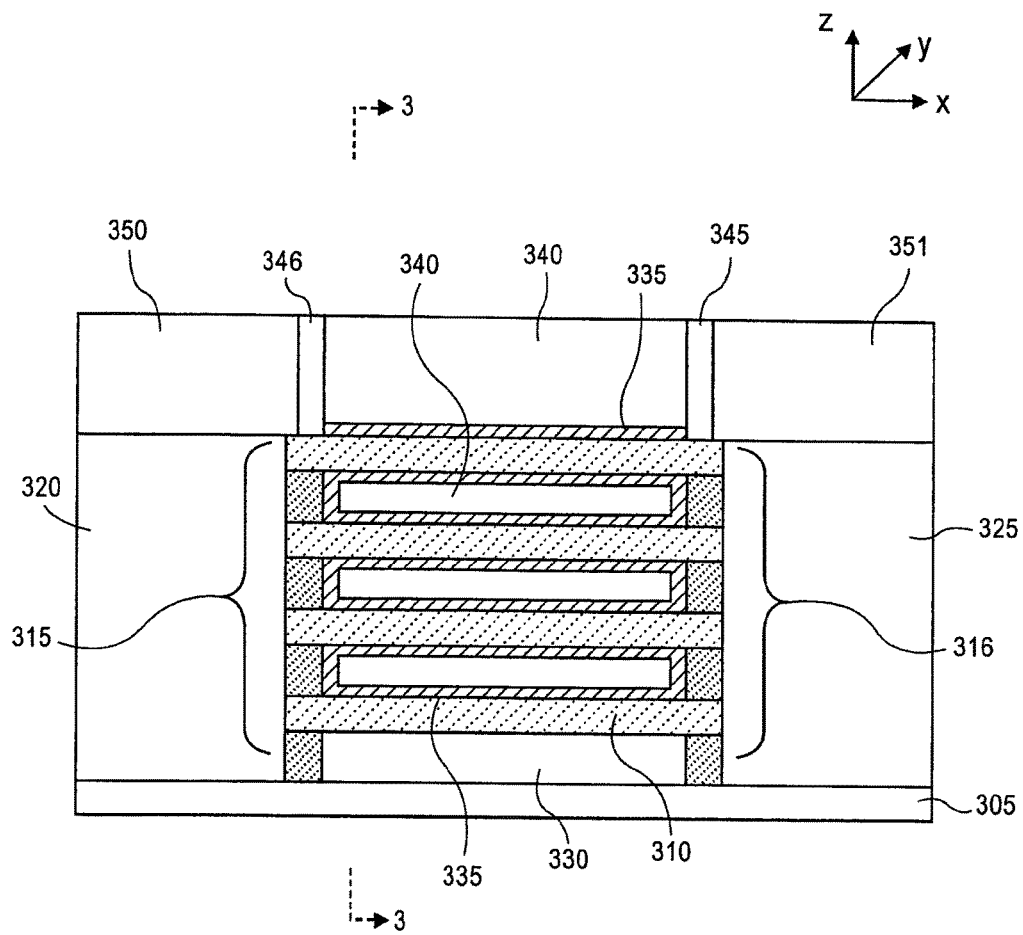
FIGS. 3A-B are schematic diagrams illustrating cross-sectional views of a transistor structure comprising nanowires or nanoribbons in the channel region.
Figure 3B:
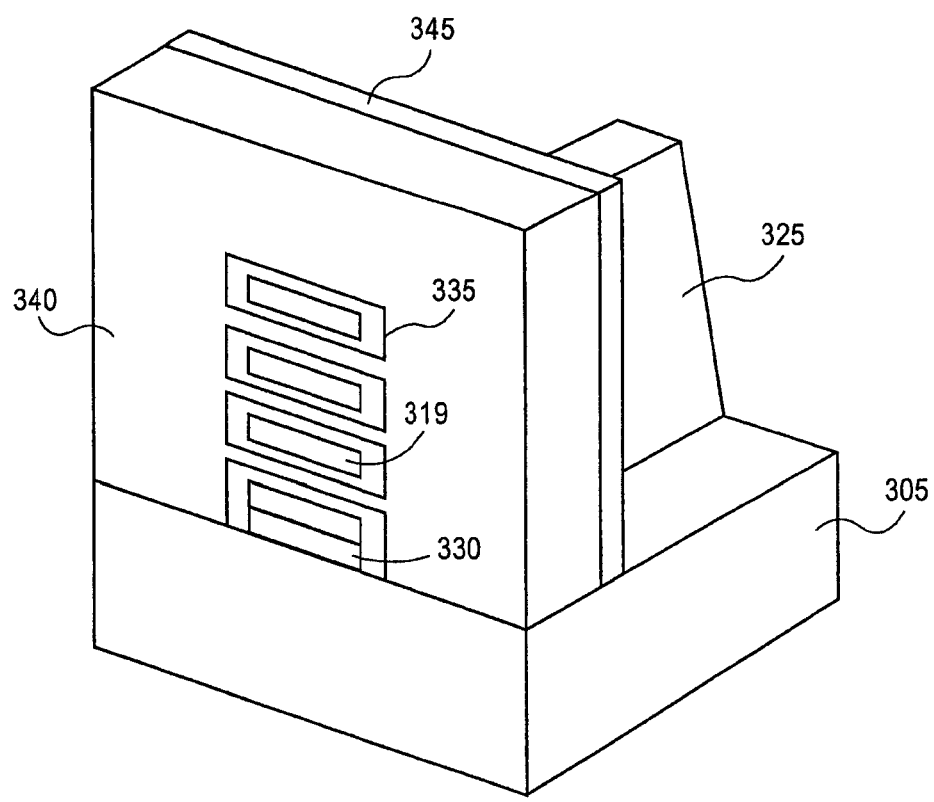

FIGS. 3A-B show transistor structures having strained nanoribbon or nanowire channel regions. In general, a nanowire can be considered to have widths and heights that are approximately equal, and nanoribbons can be considered to have a width that is larger than the height (the length dimension being the dimension along the length of the wire or ribbon). The structures of FIG. 3A-B are similar to the structures of FIGS. 1-2(A-B), however in embodiments the tensile layers are etched away to create PMOS nanowire or nanoribbon channel regions or conversely, the compressive layers are etched away to create NMOS nanowire or nanoribbon channel regions. FIG. 3B represents a view along 3-3 (a perpendicular cut into the page) of the structure of FIG. 3A. The resulting cross sectional view is rotated by 45°. In FIGS. 3A-B, a substrate 305 houses a channel region comprised nanoribbons or nanowires 310. The nanoribbons or nanowires 310 are strained relative to the substrate. In embodiments of the invention, the nanowires or nanoribbons 310 are compressively strained in PMOS channels and tensilely strained in NMOS channels. Optionally, epitaxial interlayered regions 315 and 316 are located in the transistor structure between the source and drain 320 and 325 and the nanoribbon or nanowire 310 region. The optional epitaxial interlayered regions 315 and 316 are comprised of layers exhibiting alternating compressive and tensile (or vice versa) strained layers. In general, the interlayers can be comprised of pure elements and/or mixtures of elements, such as, for example, Si and Ge, and III-V semiconductor materials (materials comprised of elements found in columns III and V of the periodic table). In embodiments of the inventions, a transistor having compressively strained nanowires or nanoribbons has a substrate 305 surface material comprising $Si_XGe_{1-X}$, a second epitaxial material comprising $Si_YGe_{1-Y}$, and a third epitaxial material comprising $Si_ZGe_{1-Z}$, where Y>X, Z<X, 1>X≥0, and 1≥Y>0, and 1>Z≥0. In alternate embodiments having compressively strained nanowires or nanoribbons, the substrate 305 comprises InP, the second epitaxial material comprises $In_XGa_{1-X}As$ where 1≥X>0.53, and the third epitaxial material, comprises $In_YGa_{1-Y}As$ where 0.53>Y≥0 or the substrate 305 comprises GaSb, the second epitaxial material comprises AlSb, and the third epitaxial material comprises InAs. In further embodiments having compressively strained nanowires or nanoribbons, substrate 305 comprises Ge, the second epitaxial material comprises $Si_XGe_{1-X}$, where 1≥X>0, and the third epitaxial material comprises $In_YGa_{1-Y}As$ where 1≥Y>0, or the substrate 305 is comprised of GaAs, the second epitaxial material is comprised of $GaAs_XP_{1-X}$ where 1>X≥0, and the third epitaxial material is comprised of $In_YGa_{1-Y}P$ where 1≥Y>0.51. In embodiments having tensilely strained nanowires or nanoribbons, the substrate 305 comprises $Si_XGe_{1-X}$, the second epitaxial material comprises $Si_YGe_{1-Y}$, and the third epitaxial material comprises $Si_ZGe_{1-Z}$ where Y<X, Z>X, 1>X≥0, and 1>Y>0, and 1>Z≥0. In further embodiments having tensilely strained nanowires or nanoribbons, the substrate 305 comprises Ge, the second epitaxial material comprises $In_YGa_{1-Y}As$ where 1≥Y>0, and the third epitaxial material comprises $Si_XGe_{1-X}$, where 1≥X>0, or the substrate 305 is comprised of GaAs, the second epitaxial material is comprised of $In_YGa_{1-Y}P$ where 1≥Y>0.51, and the third epitaxial material is comprised $GaAs_XP_{1-X}$ where X where 1>X≥0. In subsequent processing events, the second epitaxial material is etched away (either partially, leaving epitaxial interlayered regions 315 and 316, or completely leaving no epitaxial interlayered regions 315 and 316) to create nanowires or nanoribbons 310 comprised of the third epitaxial material. In embodiments of the invention, the nanowires 310 are comprised of, for example, Ge, $Si_XGe_{1-X}$, or a material comprising one or more elements from group III, IV, and V of the periodic table. Although four nanoribbons or nanowires 310 are shown in FIGS. 3A-B, other numbers of nanoribbons or nanowires 310 are possible, such as, between and including 1 and 10, between 2 and 10, and between 3 and 10 nanoribbons or nanowires in a transistor, although other numbers are also possible.

In FIG. 3A, source and drain regions 320 and 325 abut the optional epitaxial interlayered regions 315 and 316 or abut ends of the nanoribbons or nanowires 310 (not shown). In embodiments of the invention, strain with respect to the substrate is maintained in the channel region and does not require the use of source/drain stressors. In embodiments, the epitaxial interlayered regions 315 and 316 are not present and nanowires or nanoribbons 310 contact the source and drain regions 320 and 325. An insulating layer 330 is disposed between a nanoribbon or nanowire 310 and the substrate 305 and is capable of serving as the bottom gate isolation between the gate and the substrate 305. In FIGS. 3A-B, the transistor structure additionally comprises a gate dielectric 335 and a gate electrode 340. The gate dielectric 335 is disposed on the nanoribbons or nanowires 310. The gate electrode 340 is disposed on the gate dielectric 335. Optionally, insulating spacers 345 and 346 abut the gate dielectric 335 and the gate electrode 340. The transistor structure is typically covered in an insulating dielectric layer, which is partially shown as insulating regions 350 and 351.

Figure 4:
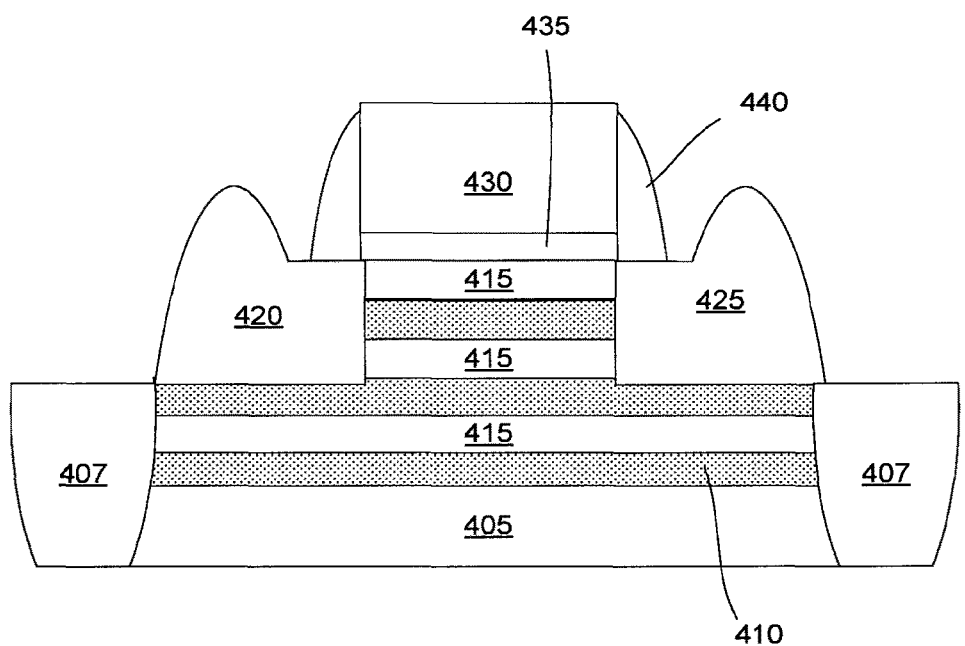
FIG. 4 illustrates a cross-sectional view of a single gate transistor structure.

FIG. 4 illustrates a single gate transistor structure having a strained channel region. Other structures are also possible for single gate transistors, such as, ones having features that are differently oriented relative to one another and structures having features with different shapes and/or sizes. For example, single gate transistor structures having source and drain regions that are not recessed relative to the channel region are also possible. In FIG. 4, a substrate layer 405 is bordered by optional isolation trenches 407 and houses a channel region comprised of oppositely strained epitaxial interlayers 410 and 415. The oppositely strained epitaxial interlayers 410 and 415 are either compressively or tensilely strained with respect to the substrate. For example, layer 410 is tensilely strained and layer 415 is compressively strained or conversely layer 410 is compressively strained and layer 415 is tensilely strained. The oppositely strained epitaxial interlayers 410 and 415 are created through crystal lattice mismatches relative to the substrate lattice. The material selected for the substrate 405 can be, for example, any material comprising elements from group III, IV, and/or V of the periodic table, and combination thereof. In general, the epitaxial interlayers 410 and 415 can be comprised of pure elements and/or mixtures of elements, such as, for example, Si and Ge, and III-V semiconductor materials (materials comprising elements found in columns III and V of the periodic table). The substrate 405 and the epitaxial interlayers 410 and 415 can be comprised of the materials described for substrates and epitaxial interlayers with respect to FIGS. 1-2(A-B). Optional isolation trenches 407 are comprised of an insulating material and can electrically isolate the transistor structure from other devices that make up the semiconductor chip. Source and drain regions 420 and 425 are shown recessed relative to the channel region. Gate electrode region 430 is on one side of the channel region and is separated from the channel region by a gate dielectric region 435. Optional insulating spacers 440 are formed during device manufacture to facilitate manufacture and serve to electrically isolate the transistor gate region. Although six layers of oppositely strained epitaxial interlayers 410 and 415 are shown in. FIG. 4, it is also possible to have other numbers of layers 415 and 410, such as, for example, between and including 3 and 25 layers or between and including 5 and 25 layers, although other numbers are also possible.

Figure 5:
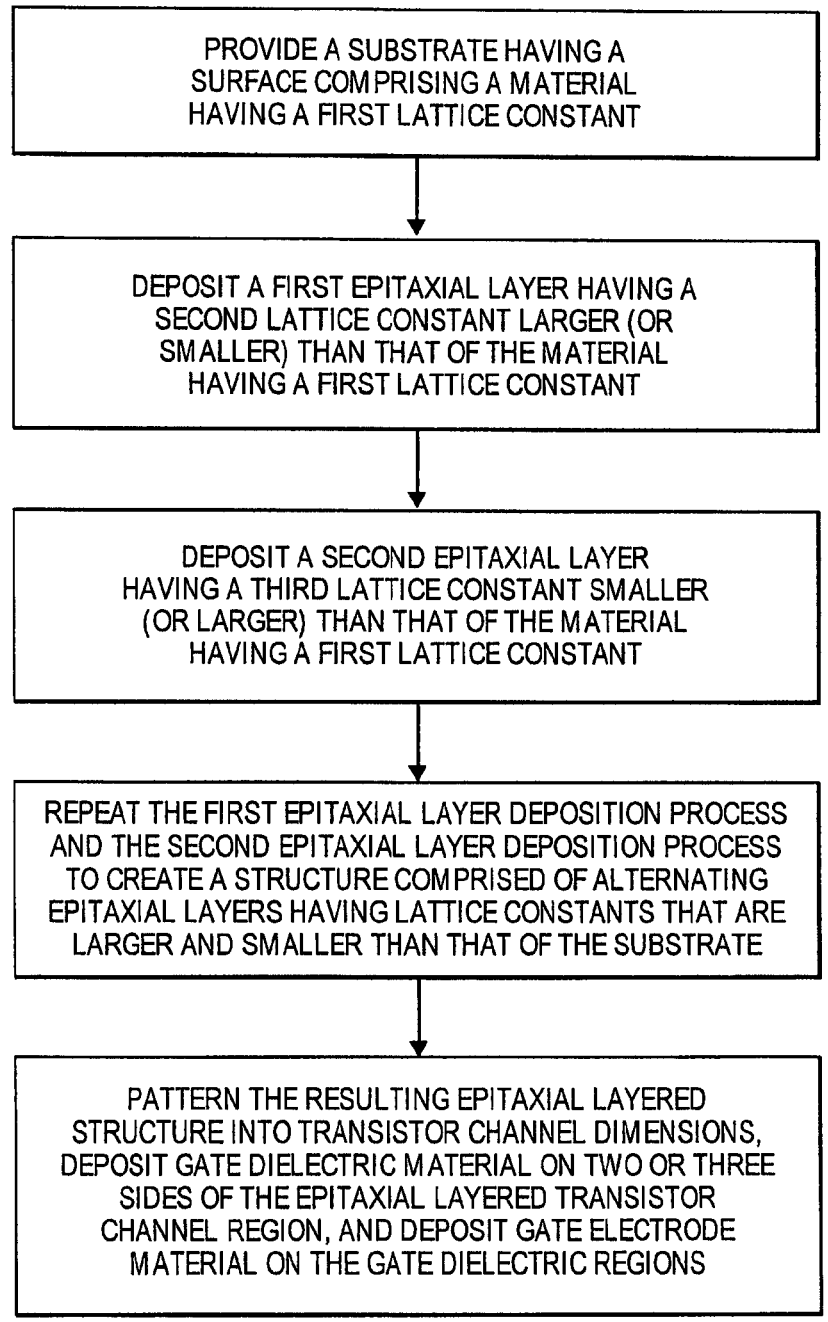
FIG. 5 is a flow chart describing methods for making the channel region of a transistor.

FIG. 5 describes methods for making a strained epitaxial layered channel region for a tri-gate or bi-gate transistor structure. In FIG. 5, a substrate is provided that has a first epitaxial material on its surface having a first lattice constant. The first epitaxial material can be a layer of epitaxial material. A second epitaxial material having a second lattice constant that is either larger (a compressive film) or smaller (a tensile film) than that of the first epitaxial material is deposited onto the substrate surface. A third epitaxial material is then deposited onto the second epitaxial material and the third epitaxial material has either a larger lattice constant (compressive) or smaller lattice constant (tensile) relative to that of the substrate. If the second layer is deposited as a compressive layer, then the third layer will be deposited as a tensile layer and the second and third films form a strain compensated stack. Conversely, if the second layer is deposited as a tensile layer, then the third layer is deposited as a compressive layer. The epitaxial materials can be deposited, for example, by ultra high vacuum chemical vapor deposition (UHV-CVD), rapid-thermal chemical vapor deposition (RTCVD), or molecular beam epitaxy (MBE). Alternating layers of epitaxial tensilely and compressively strained materials (materials having smaller and larger lattice constants relative to the substrate, respectively) are deposited onto the substrate to create a stack of layers exhibiting biaxial strain. It is believed that during the manufacture of the channel region of a transistor, the tensile and compressive interlayers (layers that are strained in the opposite direction and adjacent to each other) are more stable against relaxation because dislocations that would form to relax one layer would increase strain in the other. Because the relaxation requirements of the balanced stack system are opposing, a larger total critical thickness for the channel region can be created. Generally, a single film stack that does not use strain compensation cannot grow without relaxation or defect formation beyond 50 nm tall for lattice mismatches greater than 1.3%. In embodiments of the invention, a stack of layers can have from 3 to 25 layers or from 5 to 25 layers and/or a height of 10 nm and 100 nm or between 25 nm and 85 nm. Exemplary materials for epitaxial layers are described with respect to FIGS. 1A-B and 2A-B. The structure comprising oppositely strained interlayers is patterned into transistor channel dimensions (for example into fins for a finfet structure) converting, the substrate biaxial strain into substrate uniaxial strain. Gate dielectric material is then deposited on one, two, or three sides of the layered transistor channel region (as shown, for example, with respect to FIGS. 1A-B, 2A-B, and 4). Gate electrode material is then deposited onto the gate dielectric material.

Figure 6:
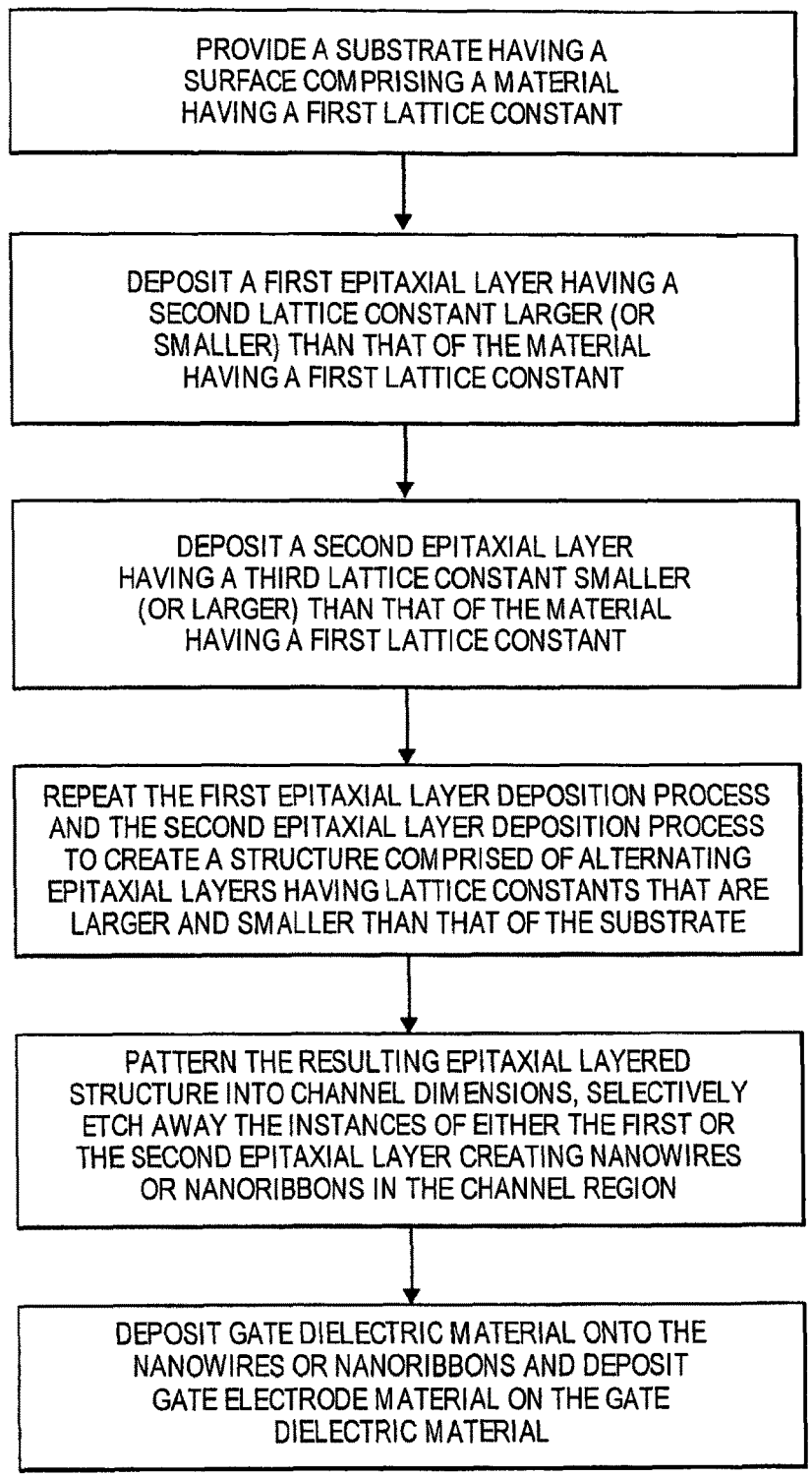
FIG. 6 is a flow chart describing additional methods for making the channel region of a transistor.

FIG. 6 describes methods for making the channel region for a transistor comprising strained nanoribbons or nanowires. In FIG. 6, a substrate is provided that has a first epitaxial material on its surface having a first lattice constant. The first epitaxial material can be a layer of material. A second epitaxial material having a second lattice constant that is either larger (a compressive film) or smaller (a tensile film) than that of the first epitaxial material is deposited onto the substrate surface. A third epitaxial material is then deposited onto the second epitaxial material and the third epitaxial material has either a larger lattice constant (compressive) or smaller lattice constant (tensile) relative to that of the substrate. If the second layer is deposited as a compressive layer, then the third layer will be deposited as a tensile layer and the second and third films form a strain compensated stack. Conversely, if the second layer is deposited as a tensile layer, then the third layer is deposited as a compressive layer. The epitaxial materials can be deposited, for example, by UHV-CVD, RTCVD, or MBE. Alternating layers of epitaxial tensilely and compressively strained materials (materials having smaller and larger lattice constants relative to the substrate, respectively) are deposited onto the substrate creating a stack of layers exhibiting biaxial strain. It is believed that during the manufacture of the channel region of a transistor, the tensile and compressive interlayers (layers that are strained in the opposite direction and adjacent to each other) are more stable against relaxation because dislocations that would form to relax one layer would increase strain in the other. Because the relaxation requirements of the system are balanced during fabrication, a larger total critical thickness for the strained channel region can be created. Generally, a single film stack that does not use strain compensation cannot grow without relaxation or defect formation beyond 50 nm for lattice mismatches greater than 1.3%. Exemplary materials for epitaxial layers are described with respect to FIGS. 3A-B.

The structure comprising oppositely strained layers is patterned into transistor nanowire or nanoribbon channel dimensions (for example, into fins) converting the substrate biaxial strain into substrate uniaxial strain. A dummy gate can be formed around the patterned channel region and source/drain regions formed at the ends of the channel region. Optionally, the dummy gate region is bounded by spacers on two sides. The dummy gate material is removed and a selective etch is performed to remove either the compressively strained epitaxial layers or the tensilely strained epitaxial layers creating nanowires or nanoribbons of the remaining material. The nanowires or nanoribbons are suspended between the source and the drain regions, in embodiments of the invention, regions of tensile and compressive interlayers remain at the ends of the nanowires or nanoribbons after the selective etch. These interlayer regions are between the ends of the nanowires or nanoribbons and the source/drain regions. In other embodiments, no regions of tensile and compressive interlayers remain after the selective etch. Gate dielectric material is deposited on four sides of (around) the exposed nanoribbons or nanowires. Gate electrode material is then deposited onto the gate dielectric material on four sides of the gate dielectric covered nanoribbons or nanowires creating a channel regions structure, for example, according to FIGS. 3A-B.

Gate dielectric materials include, for example, insulating materials, such as, silicon dioxide ($SiO_2$), silicon oxynitride, silicon nitride, and/or high-k dielectric materials. In general, a high-k dielectric is a dielectric material having a dielectric constant greater than that of $SiO_2$. Exemplary high-k dielectric materials include hafnium dioxide ($HfO_2$), hafnium silicon oxide, lanthanum oxide, lanthanum aluminum oxide, zirconium dioxide ($ZrO_2$), zirconium silicon oxide, titanium dioxide ($TiO_2$), tantalum pentaoxide ($Ta_2O_5$), barium strontium titanium oxide, barium titanium oxide, strontium titanium oxide, yttrium oxide, aluminum oxide, lead scandium tantalum oxide, lead zinc niobate, and other materials known in the semiconductor art. Gate electrode materials include, for example, materials such as Ti, W, Ta, Al, and alloys thereof, and alloys with rare earth elements, such as Er, Dy or noble metals such as Pt, and nitrides such as TaN, and TiN. Materials for sources and/or drains include, for example, Si, carbon doped Si, and phosphorus doped Si, for NMOS, and boron doped $Si_xGe_{1-x}$, boron doped Ge, boron doped $Ge_xSn_{1-x}$, and p-doped III-V compounds for PMOS applications.

Typical dielectric materials used for dielectric layers, features, and/or interlayer dielectrics (ILD) include silicon dioxide and low-k dielectric materials. Additional dielectric materials that may be used include, carbon doped oxide (CDU), silicon nitride, silicon oxynitride, silicon carbide, organic polymers such as perfluorocyclobutarte or polytetrafluoroethylene, fluorosilicate glass (FSG), and/organosilicates such as silsesquioxane, siloxane, or organosilicate glass. The dielectric layer may include pores to further reduce the dielectric constant.

Devices shown herein can comprise additional structures, such as insulating layers enclosing devices, additional substrate layers, metal trenches and vias connecting sources and drains to other components of an IC device, and other additional layers and/or devices. Components illustrated as one layer for simplicity, can comprise a plurality of layers of the same or a different material depending, for example, on the manufacturing processes employed in constructing the device and the desired properties of the device.

Implementations of the invention are housed on a substrate, such as a semiconductor wafer. Substrate surfaces on which transistor structures according to embodiments of the invention can be formed include, for example, H-terminated silicon, silicon dioxide, silicon, silicon germanium, a group III-V (or a group 13-14 in additional periodic table column numbering schemes) compound semiconductor, a main-group oxide, a metal, and/or a binary or mixed metal oxide. Layers and layers comprising devices can also be described as the substrate or part of the substrate on which embodiments of the invention are fabricated. The substrate base on which semiconductor devices are built is typically a semiconductor wafer that is diced apart to yield individual IC chips. The base substrate on which a chip is built is typically a silicon wafer, although embodiments of the invention are not dependent on the type of substrate used. The substrate could also be comprised of germanium, indium antimonide, lead telluride, indium arsenide, indium phosphide, gallium arsenide, gallium antimonide, and/or other group III-V materials either alone or in combination with silicon or silicon dioxide or other insulating materials.

Figure 7:
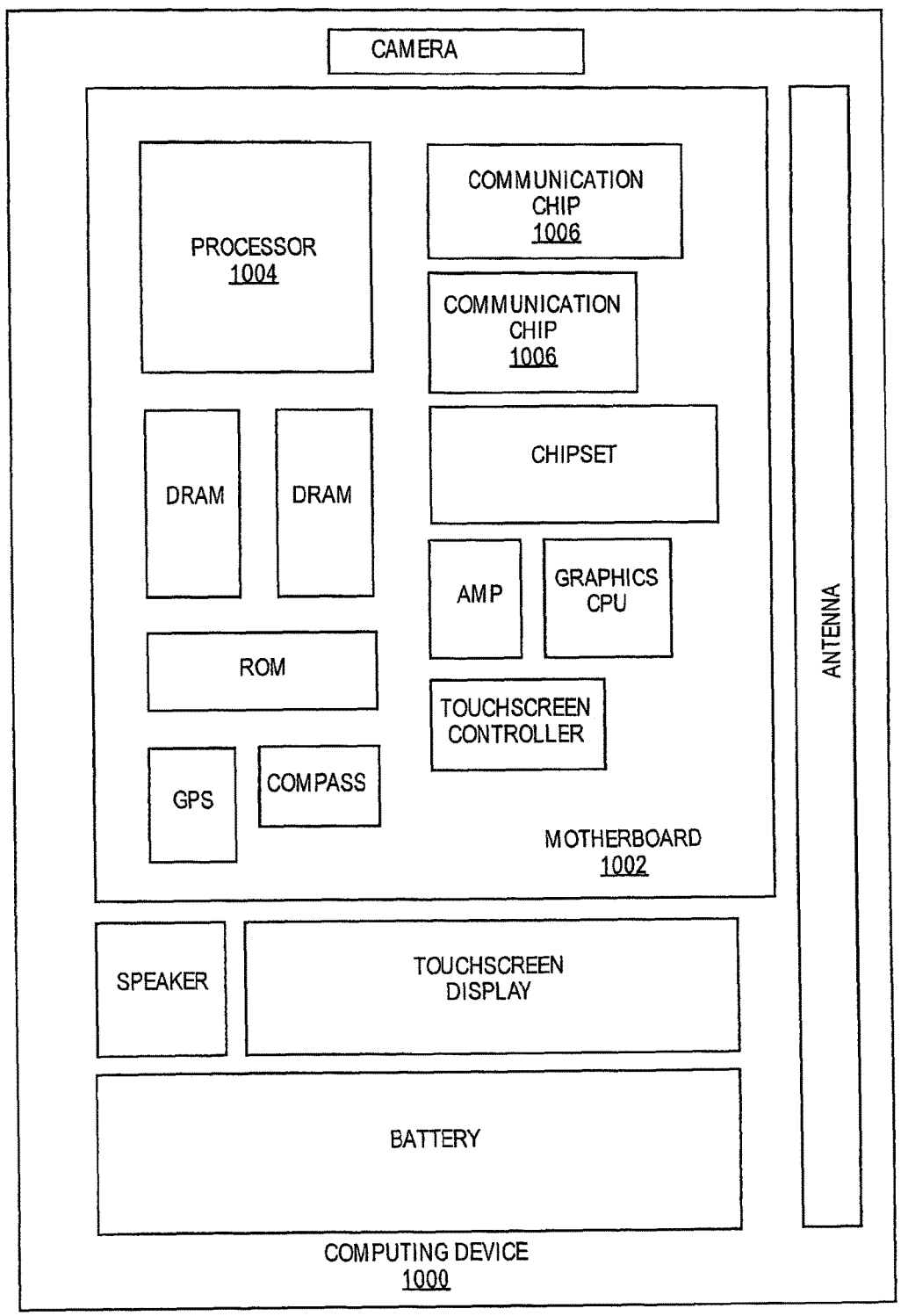
FIG. 7 is a computing device built in accordance with an implementation of the invention.

FIG. 7 illustrates a computing device 1000 in accordance with an implementation of the invention. The computing device 1000 houses a motherboard 1002. The motherboard 1002 may include a number of components, including but not limited to, a processor 1004 and at least one communication chip 1006. The processor 1004 is physically and electrically coupled to the motherboard 1002. In some implementations the at least one communication chip 1006 is also physically and electrically coupled to the motherboard 1002.

Depending on its applications, computing device 1000 may include other components that may or may not be physically and electrically coupled to the motherboard 1002. These other components include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more devices, such as transistors, that are formed in accordance with implementations of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip includes one or more devices, such as transistors, that are formed in accordance with implementations of the invention.

In further implementations, another component housed within the computing device 1000 may contain an integrated circuit die that includes one or more devices, such as transistors, that are formed in accordance with implementations of the invention.

In various implementations, the computing device 1000 may be a laptop, a netbook, a notebook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

In the previous description, numerous specific details are set forth, such as layouts for transistors and material regimes, in order to provide a thorough understanding of embodiments of the present invention. It will be apparent to one skilled in the art that embodiments of the present invention may be practiced without these specific details. In other instances, well-known features, such as electrical connection schemes for transistors and integrated circuit design layouts, are not described in detail in order to not unnecessarily obscure embodiments of the present invention. Furthermore, it is to be understood that the various embodiments shown in the Figures are illustrative representations and are not necessarily drawn to scale.

Persons skilled in the relevant art appreciate that modifications and variations are possible throughout the disclosure as are substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, and characteristics disclosed in the embodiments may be combined in any suitable manner in one or more embodiments. Various additional layers and/or structures may be included and/or described features may be omitted in other embodiments.

We claim:

1. An integrated circuit structure, comprising:
a first semiconductor layer above a substrate, the first semiconductor layer comprising silicon and germanium;
a second semiconductor layer on the first semiconductor layer, the second semiconductor layer comprising silicon, and the second semiconductor layer having a composition different than the first semiconductor layer;
a third semiconductor layer on the second semiconductor layer, the third semiconductor layer comprising silicon and germanium, and the third semiconductor layer having a composition different than the second semiconductor layer;
a gate electrode above the third semiconductor layer, the gate electrode having a first side opposite a second side;
a first epitaxial source or drain structure at the first side of the gate electrode, the first epitaxial source or drain structure laterally adjacent to and in contact with the first semiconductor layer, the second semiconductor layer and the third semiconductor layer, the first epitaxial source or drain structure having a substantially uniform composition; and
a second epitaxial source or drain structure at the second side of the gate electrode, the second epitaxial source or drain structure laterally adjacent to and in contact with the first semiconductor layer, the second semiconductor layer and the third semiconductor layer, the second epitaxial source or drain structure having a substantially uniform composition.

2. The integrated circuit structure of claim 1, wherein the gate electrode comprises titanium (Ti).

3. The integrated circuit structure of claim 1, wherein the gate electrode comprises tungsten (W).

4. The integrated circuit structure of claim 1, wherein the gate electrode comprises tantalum (Ta).

5. The integrated circuit structure of claim 1, wherein the gate electrode comprises aluminum (Al).

6. The integrated circuit structure of claim 1, further comprising: a gate dielectric between the gate electrode and the third semiconductor layer.

7. The integrated circuit structure of claim 6, wherein the gate dielectric comprises silicon dioxide and a high-k dielectric material.

8. The integrated circuit structure of claim 6, wherein the gate dielectric comprises a high-k dielectric material.

9. The integrated circuit structure of claim 8, wherein the high-k dielectric material comprises hafnium and oxygen.

10. The integrated circuit structure of claim 1, wherein the first semiconductor layer, the second semiconductor layer, and the third semiconductor layer form a fin.

11. The integrated circuit structure of claim 1, further comprising:
a first dielectric spacer at the first side of the gate electrode; and
a second dielectric spacer at the second side of the gate electrode.

12. A computing device:
a motherboard; and
a chip coupled to motherboard, the chip comprising a transistor comprising:
a first semiconductor layer above a substrate, the first semiconductor layer comprising silicon and germanium; a second semiconductor layer on the first semiconductor layer, the second semiconductor layer comprising silicon, and the second semiconductor layer having a composition different than the first semiconductor layer;
a third semiconductor layer on the second semiconductor layer, the third semiconductor layer comprising silicon and germanium, and the third semiconductor layer having a composition different than the second semiconductor layer; a gate electrode above the third semiconductor layer, the gate electrode having a first side opposite a second side;
a first epitaxial source or drain structure at the first side of the gate electrode, the first epitaxial source or drain structure laterally adjacent to and in contact with the first semiconductor layer, the second semiconductor layer and the third semiconductor layer, the first epitaxial source or drain structure having a substantially uniform composition; and
a second epitaxial source or drain structure at the second side of the gate electrode, the second epitaxial source or drain structure laterally adjacent to and in contact with the first semiconductor layer, the second semiconductor layer and the third semiconductor layer, the second epitaxial source or drain structure having a substantially uniform composition.

13. The computing device of claim 12, further comprising: a memory coupled to the chip.

14. The computing device of claim 12, further comprising: a battery coupled to the chip.

15. The computing device of claim 12, wherein the gate electrode comprises titanium (Ti).

16. The computing device of claim 12, wherein the gate electrode comprises tungsten (W).

17. The computing device of claim 12, wherein the gate electrode comprises tantalum (Ta).

18. The computing device of claim 12, wherein the gate electrode comprises aluminum (Al).

19. The computing device of claim 12, further comprising: a gate dielectric between the gate electrode and the third semiconductor layer.

20. The computing device of claim 12, wherein the first semiconductor layer, the second semiconductor layer, and the third semiconductor layer form a fin.

* * * * *